(12) United States Patent
Singh

(10) Patent No.: US 10,729,016 B1
(45) Date of Patent: Jul. 28, 2020

(54) SHAPE-MEMORY ALLOY CONNECTOR FOR PLATED THROUGH-HOLE

(71) Applicant: INTERNATIONAL BUSINESS MACHINES CORPORATION, Armonk, NY (US)

(72) Inventor: Prabjit Singh, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/351,695

(22) Filed: Mar. 13, 2019

(51) Int. Cl.
H01L 23/00 (2006.01)
H05K 3/30 (2006.01)
H05K 1/11 (2006.01)

(52) U.S. Cl.
CPC ............ H05K 3/306 (2013.01); H05K 1/115 (2013.01); H05K 2201/0308 (2013.01)

(58) Field of Classification Search
CPC ............ H05K 3/306; H05K 1/115; H05K 2201/0308; H01L 23/00; H01L 24/72
USPC .......................................... 174/265
See application file for complete search history.

(56) References Cited

U.S. PATENT DOCUMENTS

| 3,913,444 | A | 10/1975 | Otte |
| 4,634,201 | A | 1/1987 | Kemka |
| 4,698,663 | A | 10/1987 | Sugimoto et al. |
| 5,098,305 | A | 3/1992 | Krajewski et al. |
| 5,290,970 | A | 3/1994 | Currie |
| 5,779,134 | A | 7/1998 | Watson et al. |
| 5,979,042 | A | 11/1999 | Duke |
| 6,173,883 | B1 | 1/2001 | Gorenz, Jr. et al. |
| 6,216,938 | B1 | 4/2001 | Card, Jr. et al. |
| 6,349,871 | B1 | 2/2002 | Card, Jr. et al. |
| 6,437,254 | B1 | 8/2002 | Crudo et al. |

(Continued)

FOREIGN PATENT DOCUMENTS

| EP | 0 234 235 A1 | 1/1987 |
| EP | 0 618 861 B1 | 1/1999 |

OTHER PUBLICATIONS

"Copperset Through-Hole Plating System", https://uk.rs-online.com/webdocs/0031/0900766b800318fb.pdf (Jan. 1994 (pp. 1-2).

(Continued)

Primary Examiner — Tremesha S Willis
(74) Attorney, Agent, or Firm — Tihon Poltavets, Esq.; Kevin P. Radigan, Esq.; Heslin Rothenberg Farley & Mesiti P.C.

(57) ABSTRACT

Shape-memory alloy connectors and methods are provided for enhancing conductivity of a plated through-hole of a circuit board. A shape-memory alloy connector, including a shape-memory alloy material in deformed shape, is inserted into the plated through-hole of the circuit board. The shape-memory alloy connector is expanded within the plated through-hole by heating the shape-memory alloy material to, at least in part, transition the shape-memory alloy material towards a pre-deformed shape of the material. The transitioning of the shape-memory alloy material towards the pre-deformed shape expands the shape-memory alloy connector outward, at least in part, against plating of the plated through-hole to enhance contact of the shape-memory alloy connector with the plating of the plated through-hole.

20 Claims, 9 Drawing Sheets

(56) References Cited

U.S. PATENT DOCUMENTS

| | | | |
|---|---|---|---|
| 6,443,739 | B1 | 9/2002 | Currie |
| 6,453,549 | B1 | 9/2002 | Bhatt et al. |
| 6,539,618 | B1 | 4/2003 | Lyke |
| 6,555,761 | B2 | 4/2003 | Amir |
| 6,818,477 | B2 | 11/2004 | Veitschegger et al. |
| 6,875,931 | B2 | 4/2005 | Combs et al. |
| 7,085,135 | B2 | 8/2006 | Chu et al. |
| 7,206,203 | B2 | 4/2007 | Campbell et al. |
| 7,987,587 | B2 | 8/2011 | Becker et al. |
| 8,729,398 | B2 * | 5/2014 | Duppong ............ H05K 1/0204 174/252 |
| 9,125,301 | B2 | 9/2015 | Sloane |
| 9,408,327 | B2 | 8/2016 | Albrecht, III et al. |
| 9,480,141 | B1 | 10/2016 | Hamadeh |
| 2004/0211594 | A1 | 10/2004 | Ho et al. |
| 2013/0199767 | A1 | 8/2013 | Karidis et al. |
| 2016/0118361 | A1 * | 4/2016 | Karpati ............ H01L 23/49827 257/689 |

OTHER PUBLICATIONS

Saab, Mark A., "Applications of High-Pressure Balloons in the Medical Device Industry," Medical Device & Diagnostic Industry Magazine, Published Sep. 1, 2000 (pp. 1-10).

Gannon, Mary, "Why Use Compliant Pins in Connector Designs," https://www.connectortips.com/use-compliant-pins-connector-designs/, Jan. 16, 2014 (pp. 1-4).

Endres, Herbert, "Application and the Solder Processes," http://www.connector.com/application-and-the-solder-processes/, [Retrieved from the Internet on Jun. 14, 2018], (pp. 1-2).

Giesen et al., "Pin Assemblies for Plated Vias", U.S. Appl. No. 16/025,031, filed Jul. 2, 2018 (33 pages).

Singh et al., "Facilitating Filling a Plated Through-Hole of a Circuit Board with Solder", U.S. Appl. No. 16/167,705, filed Oct. 23, 2018 (31 pages).

* cited by examiner

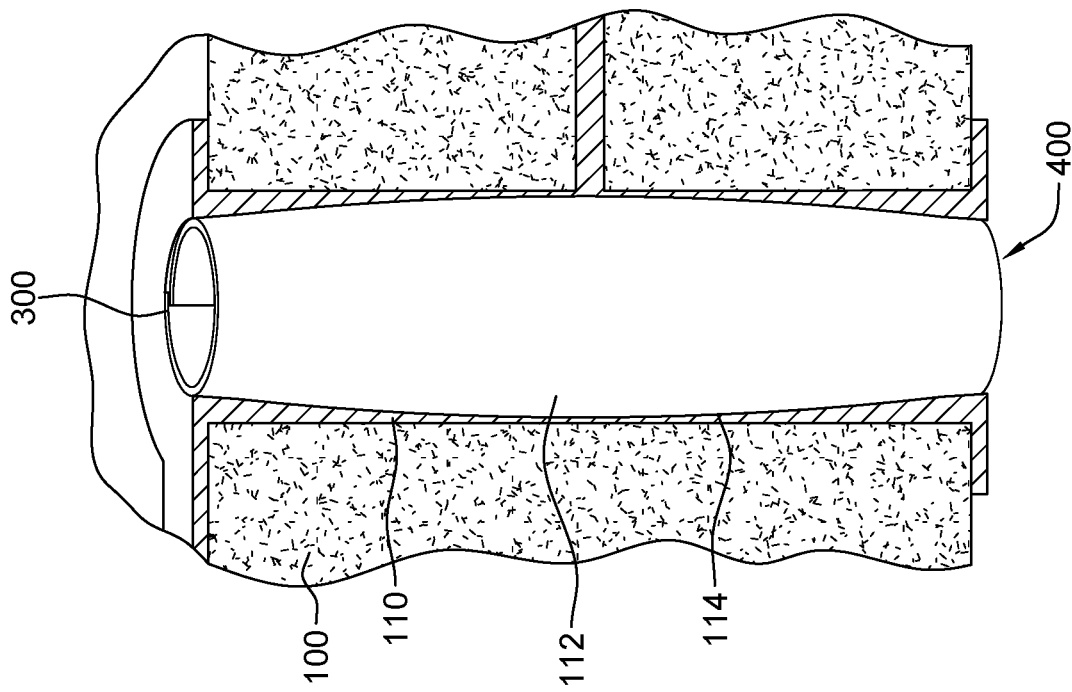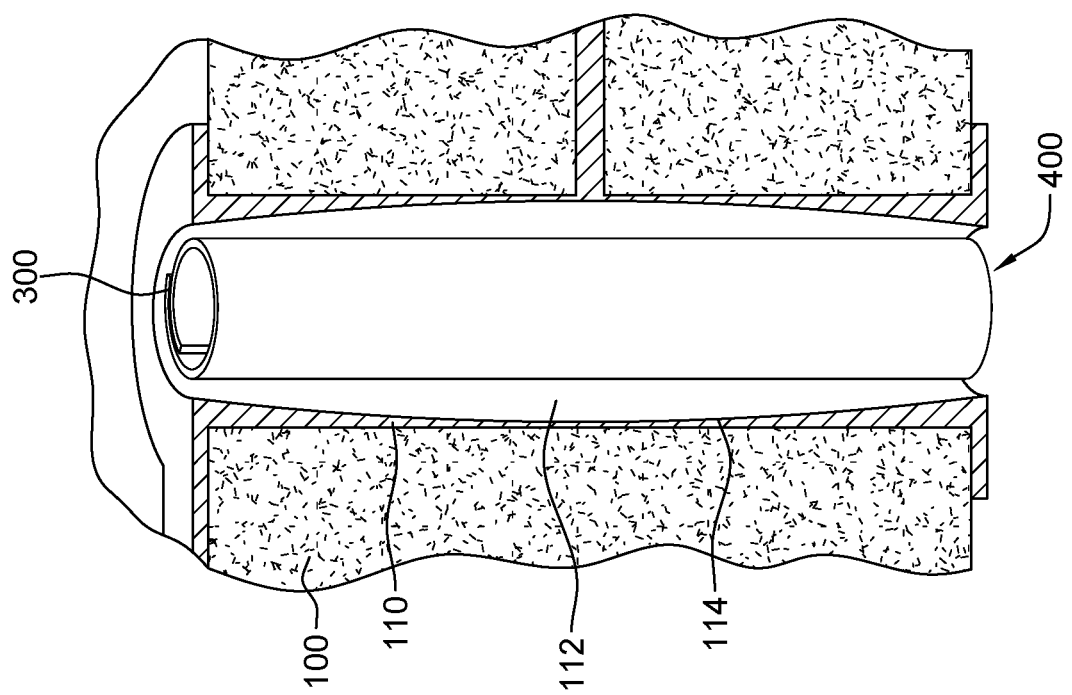

US 10,729,016 B1

SHAPE-MEMORY ALLOY CONNECTOR FOR PLATED THROUGH-HOLE

BACKGROUND

Circuit boards, such as printed circuit boards, or wiring boards, are used in a wide variety of electronic products. A circuit board mechanically supports and electrically connects electronic components and/or electrical components using conductive lines, pads and other features on or within one or more layers of the circuit board. In circuit board design, a through-hole extends through the circuit board, and can include, for instance, pads in appropriate positions on different layers on the board that are electrically connected by, for instance, a plating of the through-hole within the board. For instance, a through-hole can be made, in one or more embodiments, conductive by electroplating.

Traditionally, should a plated through-hole problem arise or be detected post manufacture of a circuit board, reworking the board can be difficult, and the board may need to be discarded.

SUMMARY

Certain shortcomings of the prior art are overcome and additional advantages are provided through the provision of a method of enhancing conductivity of a plated through-hole of a circuit board. The method includes: inserting a shape-memory alloy connector into the plated through-hole of the circuit board. The shape-memory alloy connector includes a shape-memory alloy material in a deformed shape as inserted into the plated through-hole. The method also includes expanding the shape-memory alloy connector within the plated through-hole by heating the shape-memory alloy material to, at least in part, transition the shape-memory alloy material towards a pre-deformed shape thereof. The transitioning of the shape-memory alloy material towards the pre-deformed shape expands the shape-memory alloy connector outward, at least in part, against plating of the plated through-hole to enhance contact of the shape-memory alloy connector with the plating of the plated through-hole.

In a further aspect, a method of providing a connector for a plated through-hole of a circuit board is provided. The method includes obtaining a shape-memory alloy material. The shape-memory alloy material is a one-way shape-memory alloy material. The method further includes deforming the shape-memory alloy material to a deformed shape in a de-twinned martensite phase to define, at least in part, a shape-memory alloy connector sized for insertion into the plated through-hole. When the shape-memory alloy connector is inserted into and heated within the plated through-hole, the shape-memory alloy material transitions towards a pre-deformed shape of the material. The transitioning towards the pre-deformed shape expands the shape-memory alloy connector outward, at least in part, against plating of the plated through-hole to enhance contact of the shape-memory alloy connector with the plating of the plated through-hole.

In a further aspect, a connector for a plated through-hole of a circuit board is provided. The connector includes a shape-memory alloy material. The shape-memory alloy material is a one-way shape-memory alloy material. Further, the shape-memory alloy material is in a deformed shape in a de-twinned martensite phase to define, at least in part, a shape-memory alloy connector sized for insertion into the plated through-hole. When the shape-memory alloy connector is inserted into and heated within the plated through-hole, the shape-memory alloy material transitions towards a pre-deformed shape of the material. The transitioning towards the pre-deformed shape expands the shape-memory alloy connector outward, at least in part, against plating of the plated through-hole to enhance contact of the shape-memory alloy connector with the plating of the plated through-hole.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4A is a partial cross-sectional elevational view of one embodiment of a circuit board with a plated through-hole and a shape-memory alloy connector inserted therein in a deformed shape, in accordance with one or more aspects of the present invention;

FIG. 4B depicts the circuit board and plated through-hole of FIG. 4A, with the shape-memory alloy material transitioned, at least in part, towards a pre-deformed shape, in accordance with one or more aspects of the present invention;

DETAILED DESCRIPTION

Figure 1:
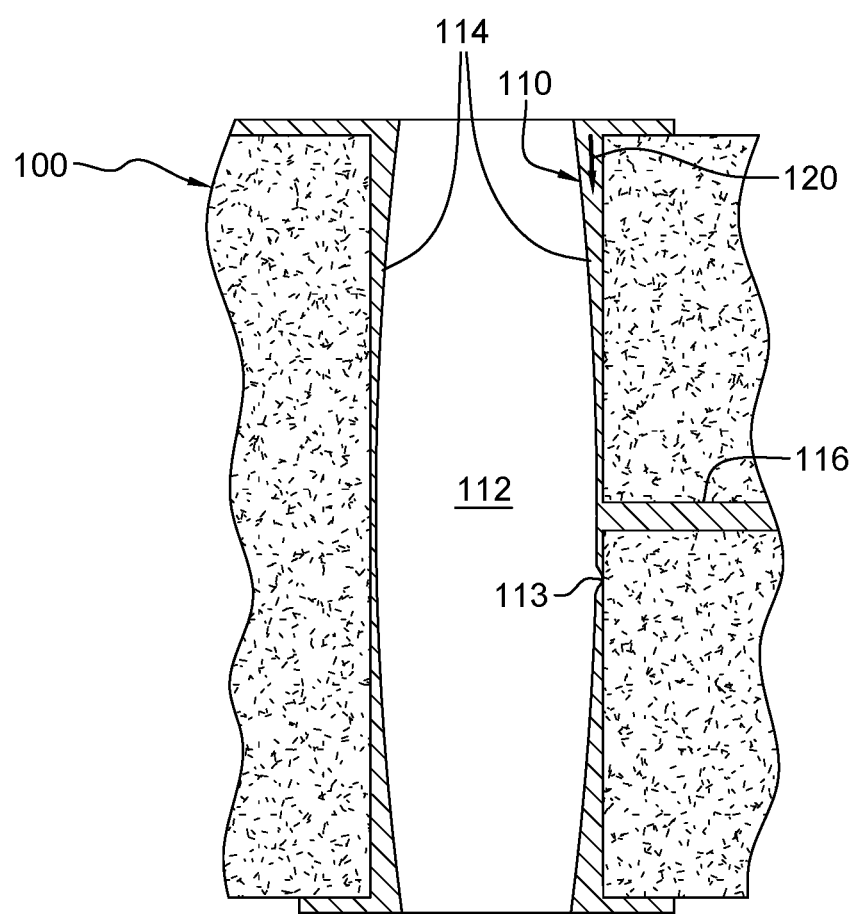
FIG. 1 depicts a partial cross-sectional elevational view of one embodiment of a circuit board with a plated through-hole to have conductivity enhanced by a shape-memory alloy connector, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description and the specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of a shape-memory alloy connector, and/or connection method, for a plated through-hole of a circuit board, such as disclosed herein.

The illustrative embodiments are described below using specific designs, architectures, layouts, schematics, or tools only as examples, and are not limited to the illustrative embodiments. Furthermore, the illustrative embodiments may be described in certain instances using particular tools, and processing environments only as example for clarity of description. The illustrative embodiments can be used in conjunction with other comparable or similarly purposed structures, systems, applications, or architectures.

The examples in this disclosure are used only for clarity of description and are not limiting to the illustrative embodiments. Additional operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages can be realized by specific illustrative embodiments. Furthermore, a particular illustrative embodiment can have some, all, or none of the advantages listed herein.

As noted, reworking a circuit board, such as a printed circuit board, wiring board, etc., is difficult post manufacture should a problem be detected or arise, such as with a plated through-hole of the circuit board. For instance, re-spinning a circuit board is costly, and hand modifications to a circuit board are slow and can be challenging. In fact, certain board issues, such as a plated through-hole defect, can be difficult to address without a new build of the circuit board. As related issues, current and heat dissipation in a circuit board are common issues to be addressed in dense circuit designs. The most congested areas have the most difficult constraints for heat dissipation, and a solution to address these constraints is often adding during design more through-holes, or increasing the capacity of the through-holes to conduct greater heat. Another circuit board issue is that, in operation, high current density could lead to electro-migration and degradation of plated through-hole walls of the board.

A variety of approaches are available for filling a defective or underperforming plated through-hole. These include, for instance, wave soldering, hand soldering, and conventional filled through-holes. Unfortunately, wave soldering requires a keep out zone of 6.35 mm around the through-hole being filled, and other components. Hand soldering also requires a similar keep out zone and would be prone to failure modes, such as partial through-hole fill. Conventional filled through-holes cannot always be done, particularly on high resolution through-holes, due to microstrip layer thickness constraints, and typically cannot be performed with components attached to the circuit board. Further, filled plated through-holes typically would not be undertaken for fixing an individual through-hole, and can be a costly rework if undertaken. The thicker the board, the higher the likelihood that quality control problems could occur.

By way of example, FIG. 1 depicts one embodiment of a plated through-hole 110 within a circuit board 100 which can benefit from reworking to enhance electrical and/or thermal characteristics of the plated through-hole. As illustrated, plated through-hole 110 can include a through-hole 112, formed within circuit board 100, which has been plated 114, such as by electroplating, with a conductive material, such as a metal (e.g., copper). In one or more implementations, FIG. 1 is an example of a high resolution through-hole, where the resolution of the through-hole is defined by the board thickness divided by the through-hole diameter. In high resolution through-holes today, a slight barreling effect can sometimes occur (as shown) where the electroplated through-hole wall bows slightly outward in the middle. This bowing of the through-hole wall can be intrinsic to the plating process. Also, as shown in FIG. 1, circuit board 100 can have one or more power planes 116 centrally disposed within the circuit board and electrically connected to plated through-hole 110. As illustrated, in this configuration the bulk of the current 120 passing through plated through-hole 110 travels along the shortest path to power plane 116, with a smaller amount of current passing along the opposite side of plated through-hole 110, and then up to power plane 116. Due to one or more discontinuities 113 in plating 114, circuit flow through one or more paths can be disrupted, which can result in a greater amount of current flow in another region than anticipated, potentially resulting in further degradation of the plating 114.

A circuit board with one or more poor-quality (e.g., unfilled) plated through-holes (PTHs) can lead to a rejection of the circuit board during fabrication. Disclosed herein, in one or more aspects, are connectors and connection methods which facilitate, for instance, repair of a defective plated through-hole, such as a high-aspect ratio plated through-hole, using one-way shape-memory alloy material and (in one or more embodiments) a very local heat-affected zone.

More particularly, in one or more aspects, connection methods and connectors are provided herein to facilitate and/or enhance electrical connection within a plated through-hole of a circuit board and/or thermal conduction through the plated through-hole of the circuit board. Advantageously, the methods and connectors disclosed use, or are formed with, a one-way shape-memory alloy material.

Figure 2:
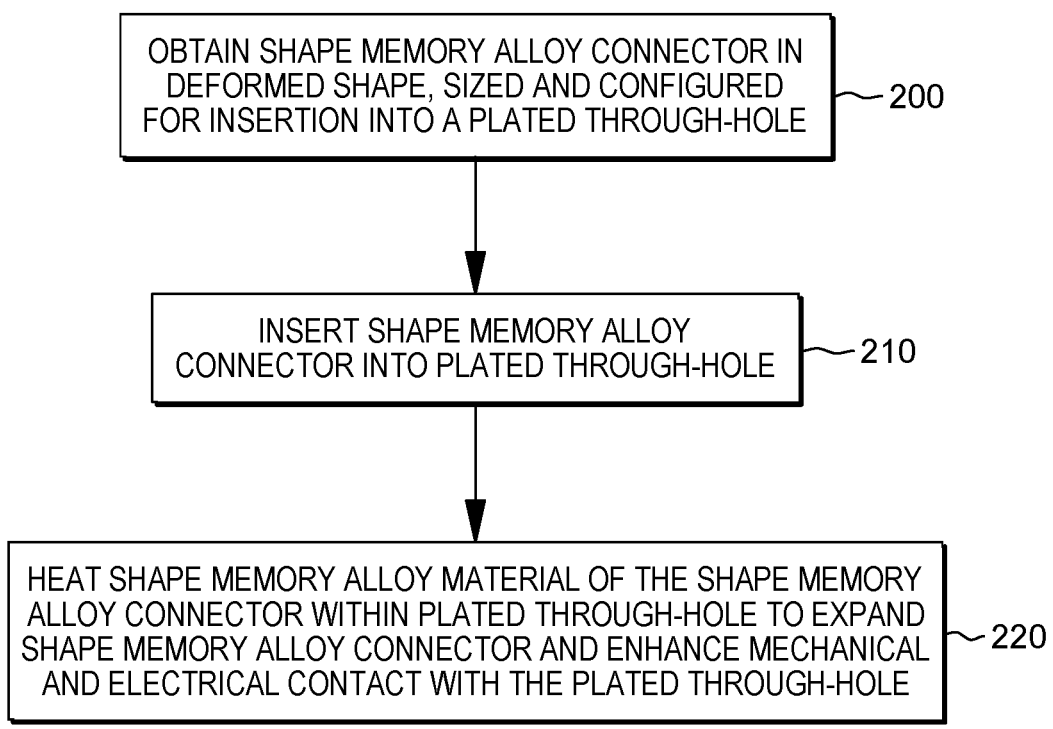
FIG. 2 depicts one embodiment of a process of enhancing conductivity of a plated through-hole of a circuit board using a shape-memory alloy connector, in accordance with one or more aspects of the present invention.

FIG. 2 depicts an overview of one embodiment of a method of enhancing conductivity of a plated through-hole of a circuit board, in accordance with one or more aspects of the present invention. As illustrated, a shape-memory alloy connector is obtained, or provided, in a plastically deformed shape. The connector is sized and configured for insertion into a plated through-hole to be electrically and/or thermally enhanced 200. By way of example, the shape-memory alloy connector is formed of, or includes, a shape-memory alloy material that has been plastically deformed to a desired shape, and that is slightly smaller in diameter than a diameter of the plated through-hole to be repaired. The shape-memory alloy connector is inserted into the plated through-hole 210, and heated within the plated through-hole to expand the shape-memory alloy connector by transitioning the shape-memory alloy material towards a pre-deformed shape of the material (as explained further herein), where the transitioning towards the pre-deformed shape expands the shape-memory alloy connector outward, at least in part, against plating of the plated through-hole to enhance mechanical contact with the plated through-hole 220.

In one or more embodiments, the shape-memory alloy material of the shape-memory alloy connector is a one-way shape-memory alloy material. Further, the heating is of a sufficient temperature for a one-way martensite to austenite phase transformation of the shape-memory alloy material to occur within the plated through-hole. The shape-memory alloy connector can take a variety of configurations. For instance, in one or more embodiments, the shape-memory alloy connector can be configured as a coil or sleeve with a diameter slightly smaller than the diameter of the plated through-hole to be repaired to facilitate insertion of the connector into the plated through-hole. After being inserted, the shape-memory alloy coil or sleeve is heated to transition the material towards a pre-deformed shape, where the transitioning forces or expands the shape-memory alloy connector outward, at least in part, against the plating of the plated through-hole to enhance, for instance, electrical and mechanical contact of the shape-memory alloy connector with the plating of the plated through-hole. In one or more other embodiments, the shape-memory alloy connector is configured as a pin, with the shape-memory alloy material having been stretched to achieve a plastically deformed shape of reduced diameter. In this embodiment, heating of the shape-memory alloy material to transition the shape-memory alloy material towards the pre-deformed shape expands the diameter of the shape-memory alloy pin within the plated through-hole to enhance, for instance, electrical and mechanical contact of the shape-memory alloy pin with the plating of the plated through-hole.

Advantageously, the shape-memory alloy connection method disclosed herein utilizes an expansion of the connector and a pressing of the connector against the plated through-hole wall. In one or more embodiments, a relatively small rise in temperature is used for one-way martensite to austenite phase transformation of the deformed shape-memory alloy material. Further, a shape-memory alloy connector and method as disclosed herein, can be used in place of bulk solder paste, which can otherwise lead to flux trapped within the plated through-hole. Further, in one or more embodiments, thin solder plating can be applied over the shape-memory alloy material, and localized heating, for instance, via a nichrome wire or a laser beam (such as an infrared radiation (IR) laser beam), can be employed to further heat the solder within the plated through-hole, with the heat and solder-affected zone limited to a very small zone about the through-hole.

Figure 3D:
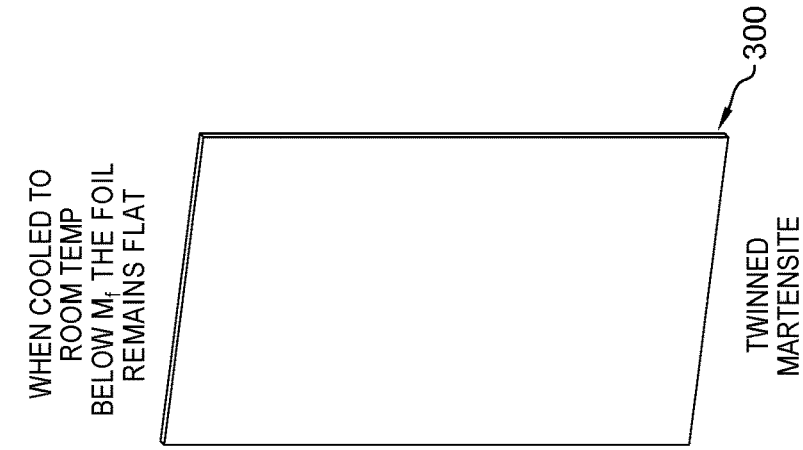
FIGS. 3A-3D depict one embodiment of a one-way shape-memory alloy material undergoing plastic deformation, heating and cooling, which is used in a shape-memory alloy connector, in accordance with one or more aspects of the present invention.
Figure 3C:
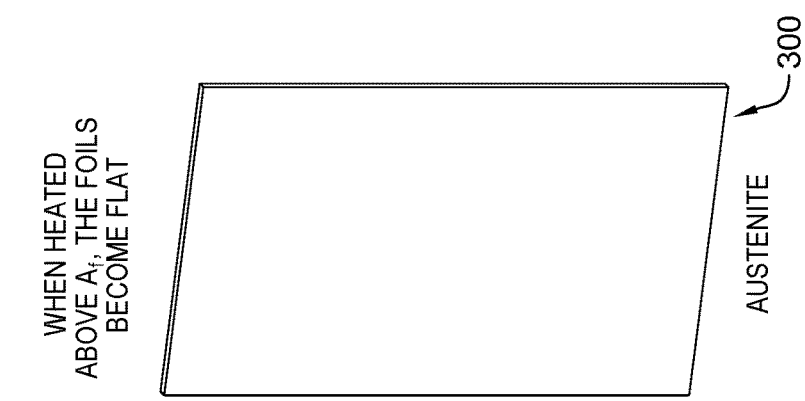
Figure 3B:
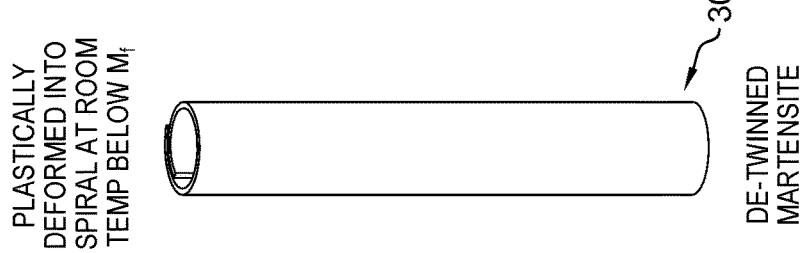
Figure 3A:
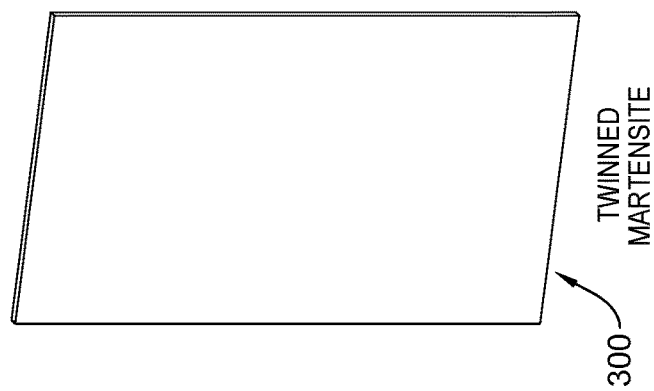

FIG. 3A depicts one embodiment of a shape-memory alloy material 300, which (in one or more embodiments) can be a starting material at room temperature below $M_f$. As understood in the art, shape-memory alloy (SMA), smart metal, memory metal, memory alloy, smart alloy, is an alloy that remembers its original shape, and when deformed, returns to the pre-deformed shape when heated. Two prevalent shape-memory alloys are copper-aluminum-nickel and nickel-titanium (NiTi) alloys, however, shape-memory alloys can also be created by alloying zinc, copper, gold and iron. Today NiTi-based shape-memory alloys are preferred due to their stability, practicality, and superior thermal-mechanical performance. Shape-memory alloys can exist in two different phases, with three different crystal structures (i.e., twinned martensite, de-twinned martensite, and austenite). In FIG. 3A, the shape-memory alloy is, for instance, twinned martensite at room temperature, below the finished martensite temperature ($M_f$), by way of example.

In FIG. 3B, the shape-memory alloy material has been plastically deformed into a coil or spiral, for instance, at room temperature below $M_f$, and now has a de-twinned martensite crystal structure. In use, heat can be applied to the shape-memory alloy material in deformed shape so that the shape-memory alloy returns to its pre-deformed shape, as illustrated in FIG. 3C. In this state, the shape-memory alloy has an austenite crystal structure. By way of example, the finished austenite temperature ($A_f$) is set for a particular application based on the selection of material percentages within the alloy material. In one or more embodiments, the finished austenite temperature ($A_f$) for a NiTi alloy could be in the range of, for instance, −5° C. to 121° C., while the finished martensite temperature ($M_f$) could be in the range of −53° C. to 59° C. In one specific application, the shape-memory alloy material is a nickel-titanium (NiTi) alloy, where the nickel and titanium percentages are selected such that the finished martensite temperature ($M_f$) approximately 24° C., and the finished austenite temperature ($A_f$) is approximately 71° C.

In FIG. 3D, the shape-memory alloy material has been cooled back to room temperature, for instance, below the finished martensite temperature ($M_f$), where the shape-memory alloy material is shown to remain in its pre-deformed shape. In this example, the cooled shape-memory alloy returns to a twinned martensite crystalline structure. The transition from martensite phase to austenite phase is dependent on temperature, and stress, not time. The shape-memory alloy employed herein is a one-way shape-memory alloy material. With a one-way shape-memory alloy material, the material in cold state can be plastically bent or stretched or coiled, and hold its deformed shape until heated above the transition temperature. Upon heating, the shape transitions to (or attempts to transition to) its original shape, that is, the pre-deformed shape. When the metal alloy cools again, it will remain in the pre-deformed shape, that is, until deformed again. With the one-way effect, cooling from high temperature does not cause a macroscopic shape change. A deformation is necessary to create the low temperature shape. Upon heating, transformation starts at an austenite start temperature ($A_s$), and is completed at the austenite finish temperature ($A_f$), which can be, for instance, 2°-20° hotter, depending on the alloy or the loading conditions. The austenite start temperature is determined by the alloy type, and composition, and can vary, for instance, between −24° C. and 100° C. for the temperature transformation values noted above with respect to the finished austenite temperature ($A_f$).

Shape-memory alloys can be made by, for instance, casting, using vacuum arc melting, or induction melting. There are techniques known in the art used to keep impurities in the alloy to a minimum and ensure that the metals are mixed well. An ingot can then be hot-rolled into longer sections and then drawn, for instance, to form a film, coil or a wire, depending on the implementation. The way in which a shape-memory alloy is trained or deformed can depend on the properties desired. The training dictates the shape that the alloy noted above will remember when heated. The copper-based and NiTi-based shape-memory alloys can be manufactured in almost any desired shape and size. An advantage of using shape-memory alloys is the high level of recoverable plastic strain that can be induced. For instance, recoverable strain in the materials can hold without permanent damage up to, for instance, 8% for some alloys.

By way of further explanation, FIG. 4A depicts a shape-memory alloy connector 400, which includes a shape-memory alloy material 300 in a deformed shape, inserted into plated through-hole 110 with plating 114, formed in circuit board 100, such as described above in connection with respect to FIG. 1. In the embodiment depicted, shape-memory alloy material 300 is coiled in plastically deformed shape to, in part, facilitate insertion of the connector into through-hole 112, with the coil being a deformed shape of the shape-memory alloy material in de-twinned martensite phase, such as described above in connection with FIGS. 3A-3D. The size and configuration of shape-memory alloy connector 400 can be chosen based, in part, on dimensions of the plated through-hole into which the connector is to be inserted. For instance, NiTi-based shape-memory alloy material is readily commercially available in 0.05 mm thickness, which can be plastically deformed into a coil or sleeve to be slightly smaller than a 0.2 mm internal diameter, high-aspect ratio plated through-hole, such as might be employed today. By way of example, a 0.43-0.46 mm wide shape-memory alloy foil could be metallurgically stabilized at 400°–600° C. for thirty minutes, cooled and then pulled through a die with a 0.19 mm exit diameter. As the foil enters the die, it rolls into a circular cross-section, with diameter smaller than the diameter of the plated through-hole within which the connector is to be inserted.

In FIG. 4B, the shape-memory alloy material has undergone heating (in one embodiment) to transition the material, at least in part, towards its pre-deformed shape via a one-way martensite-to-austenite phase transformation, with the pre-deformed shape being, for instance, such as shown in FIG. 3C, in one example. The shape-memory alloy material is unable to fully reach the pre-deformed shape due to the constraints of the plated through-hole. In this implementation, transitioning the shape-memory alloy material towards the pre-deformed shape forces the shape-memory alloy connector outward, at least in part, against plating 114 of the plated through-hole (as illustrated in FIG. 4B), to enhance contact of shape-memory alloy connector 400 with the plating 114 of the plated through-hole 110. More particularly, shape-memory alloy connector 400 can be inserted into plated through-hole 110 at room temperature, below the finished martensite temperature ($M_f$) of the alloy material. The shape-memory alloy connector (or coil) at room temperature below $M_f$ has a tight radius, which then expands when heated above the finished austenite temperature ($A_f$), as illustrated in FIG. 4B. This expanded shape is then retained when the assembly is cooled back to room temperature.

Figure 4C:
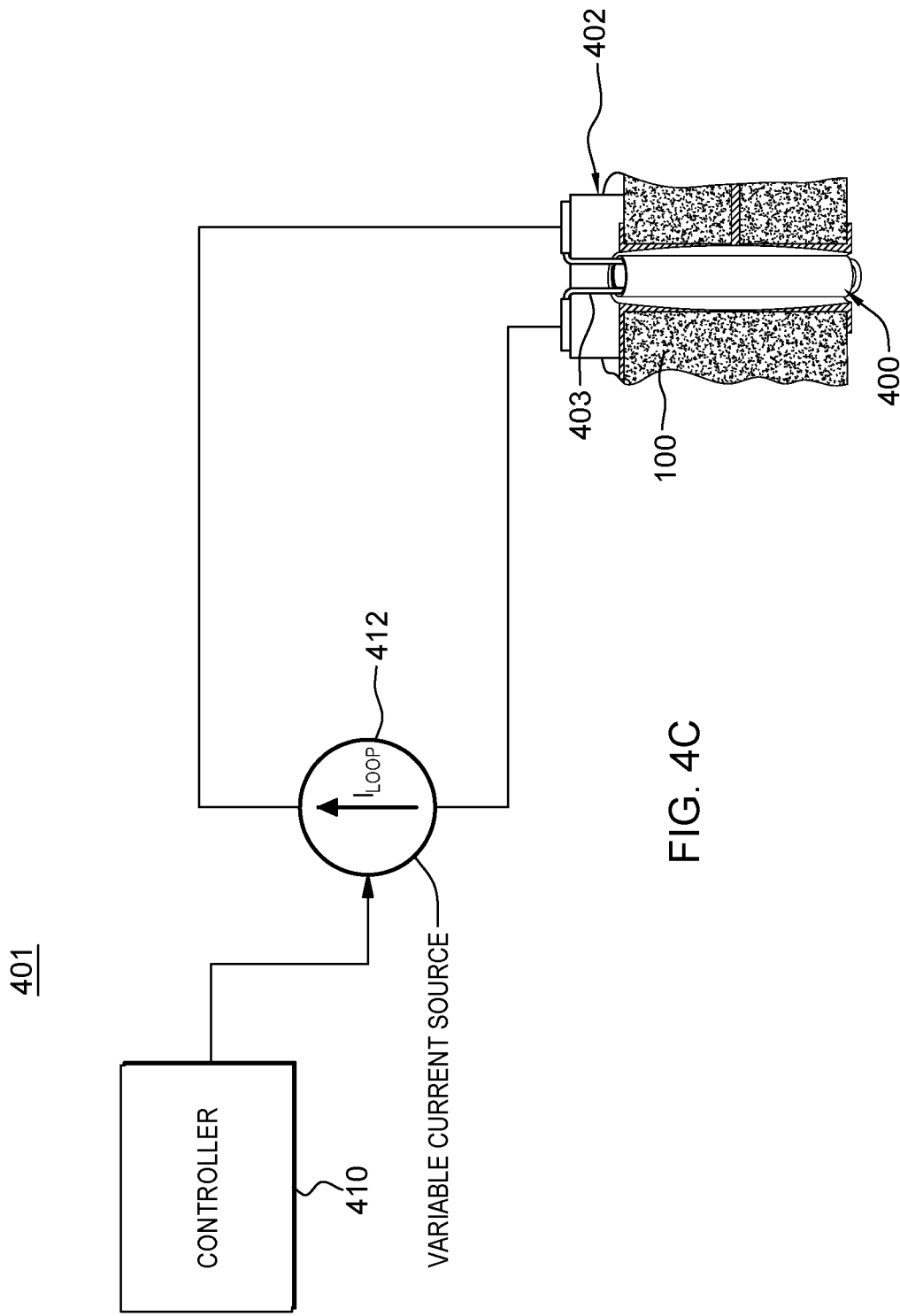
FIG. 4C depicts one embodiment of an apparatus for applying heat to shape-memory alloy material within a plated through-hole of a circuit board to transition the material from deformed shape to a pre-deformed shape, in accordance with one or more aspects of the present invention.

By way of example, FIG. 4C depicts one embodiment of an apparatus 401 which includes, in part, an apparatus 402 with a wire probe 403 extending into a plated through-hole of circuit board 100, and in particular, into a center region of the shape-memory alloy connector 400 inserted into the plated through-hole, as in FIG. 4A. In one embodiment, wire probe 403 could be a nichrome wire sized for insertion into the middle of connector 400 within the plated through-hole. The nichrome wire can be insulated by placing the wire in a glass sleeve. Further, the nichrome wire is heated by pumping current through the wire. As shown, apparatus 401 also includes a controller 410 and a variable current source 412. In one or more embodiments, controller 410 controls variable current source 412 to control current applied to apparatus 402 to heat wire probe 403, and thereby heat the shape-memory alloy material within the plated through-hole to transition the material towards the pre-deformed shape via a one-way martensite-to-austenite phase transformation, and thereby extend the shape-memory alloy connector within the plated through-hole to enhance contact of the connector with the plating of the plated through-hole.

In one or more embodiments, the heating can be a time-based process (to ensure reaching the finished austenite temperature ($A_f$), or a temperature-based process, as desired to achieve the finished austenite temperature ($A_f$) within the through-hole. More particularly, the wire probe heater heats and transforms the shape-memory alloy material from martensite-to-austenite phase. When cooled, the martensite phase returns. As explained further herein, in one or more embodiments, solder can be applied on an outer surface of the coil. In such embodiments, heat from the wire probe can also be used to melt the solder, forming a metallurgical bond between the coil and the plated through-hole. The wire probe heater is turned off, and when the solder solidifies, the heater is removed from the plated through-hole. Note that in one or more other embodiments, other heating sources, such as a laser source, or more particularly, an infrared radiation (IR) laser source, could be used in place of a wire probe to apply the desired local heating to the shape-memory alloy material once inserted into the plated through-hole. For instance, an IR laser can be positioned to shine down the axis of the plated through-hole to heat the shape-memory alloy material and transform the material as discussed herein within the plated through-hole, and also can be used to melt any solder on an outer surface of the material. Those skilled in the art will note that any other localized heating source could be used to heat the shape-memory alloy material employed to its finished austenite temperature ($A_f$) within the through-hole.

Figure 5B:
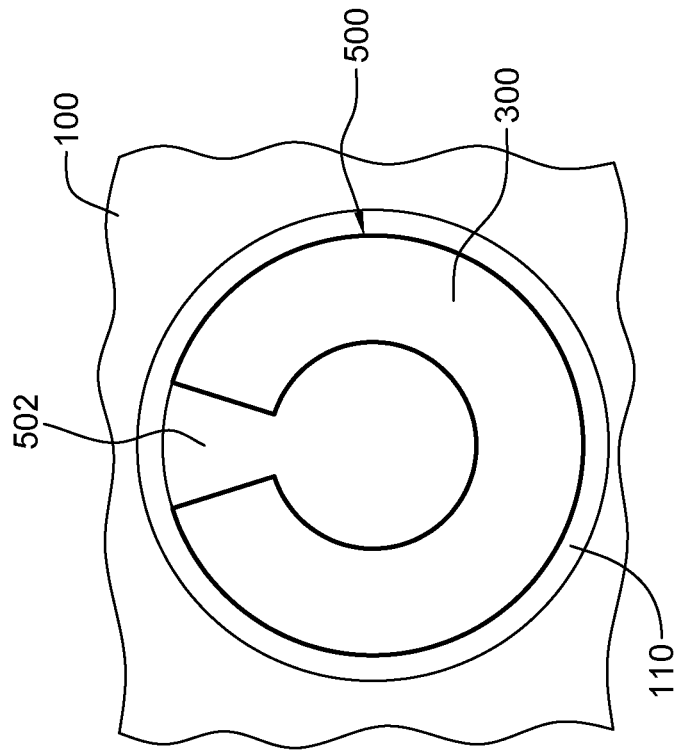
FIG. 5B depicts the embodiment of FIG. 5A, with the shape-memory alloy material expanded towards a pre-deformed shape, in accordance with one or more aspects of the present invention.
Figure 5A:
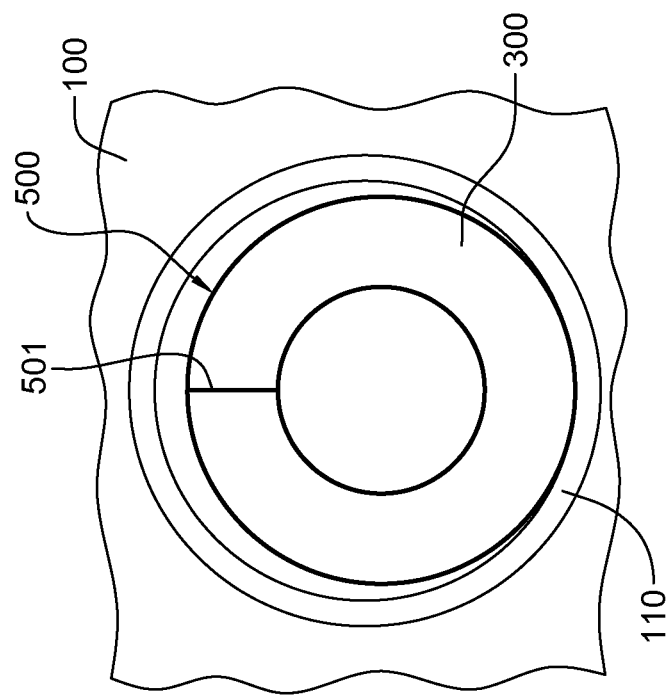
FIG. 5A is a plan view of another embodiment of a shape-memory alloy connector, configured as a sleeve with a lengthwise slit, and shown inserted into a plated through-hole in deformed shape, in accordance with one or more aspects of the present invention.

As noted, the shape-memory alloy connector can be formed into a variety of configurations. In the embodiment of FIGS. 5A & 5B, a shape-memory alloy connector 500 is shown with shape-memory alloy material 300 deformed into the shape of a sleeve sized for positioning within plated through-hole 110 in circuit board 100. In FIG. 5A, a top plan view is shown with shape-memory alloy connector 500 inserted into plated through-hole 110, for instance, at room temperature below the finished martensite temperature ($M_f$), and in FIG. 5B, the connector has been heated above the finished austenite temperature ($A_f$), and then cooled to room temperature below finished martensite temperature ($M_f$). A lengthwise slit 501 in the shape-memory alloy material 300 allows shape-memory alloy connector 500 to expand, for instance, to roughly the shape of plated through-hole 110, forming a slight gap 502 between the ends of the shape-memory alloy material 300. As with the embodiment of FIGS. 4A & 4B, the plated through-hole wall constrains the expanding sleeve in the example of FIG. 5B, resulting in the shape-memory alloy connector applying an outward force against the plating of the plated through-hole to enhance contact of the shape-memory alloy connector with the plating of the plated through-hole.

Figure 6:
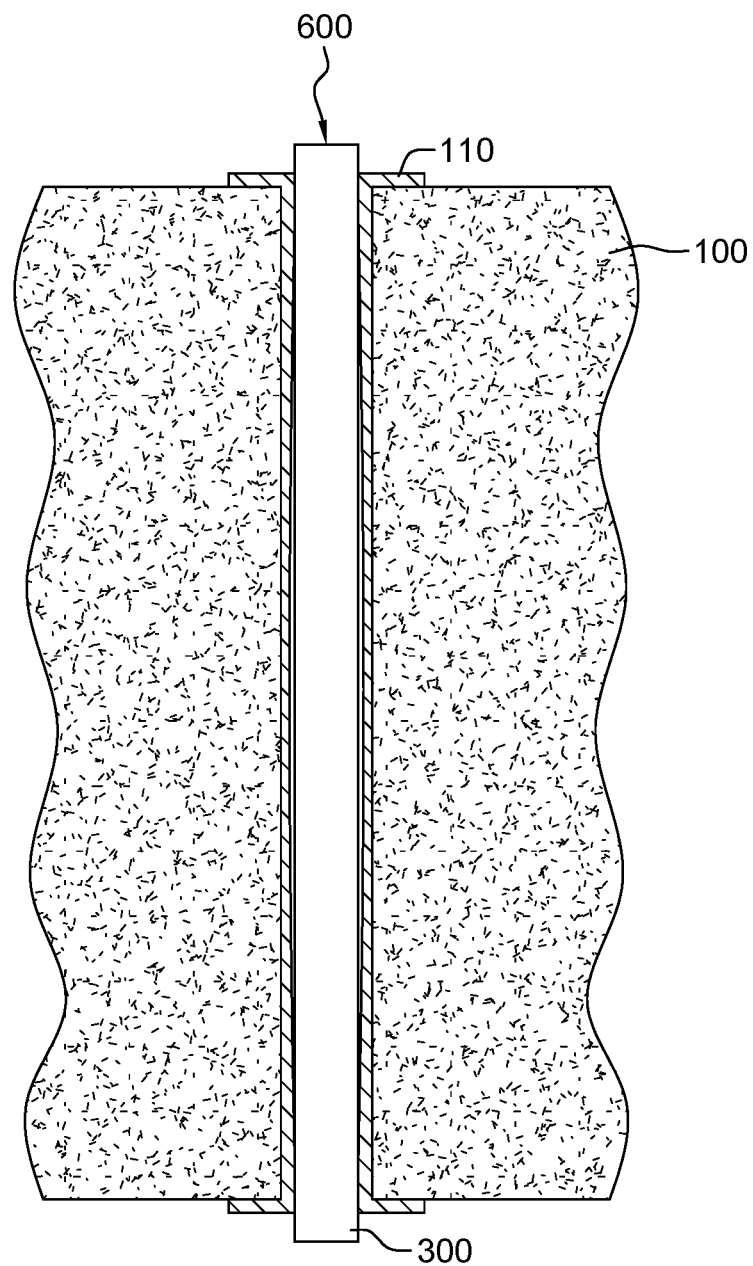
FIG. 6 depicts another embodiment of a shape-memory alloy connector, configured as a pin, and inserted into a plated through-hole in deformed shape, in accordance with one or more aspects of the present invention.

FIG. 6 depicts a further embodiment of a shape-memory alloy connector 600, which is formed of a shape-memory alloy material 300, drawn in the form of a wire sized for insertion into a plated through-hole 110 of circuit board 100. In this example, the shape-memory alloy material is plastically deformed by stretching the material, reducing the diameter of the wire, and facilitating insertion of the wire into the plated through-hole. When heat is applied to the wire above the finished austenite temperature ($A_f$), the wire diameter expands, thus forming a good mechanical and electrical bond with the plated through-hole wall. As explained herein, the wire could be plated with a conductor, such as a tin metal or a low-temperature solder, for instance, 10 μm thick, to form a secure bond with the plated through-hole via. The tin metal or low-temperature solder could be melted by joule-heating the wire.

Figure 7A:
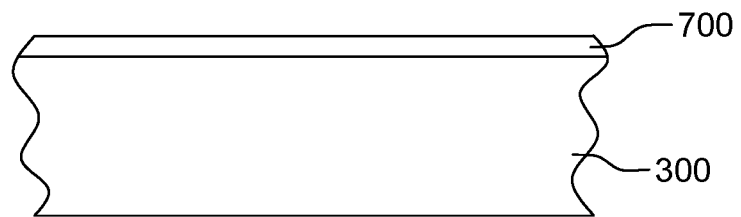
FIG. 7A is a partial depiction of another embodiment of a shape-memory alloy connector, in accordance with one or more aspects of the present invention.

By way of further explanation, FIG. 7A depicts a partial embodiment of a shape-memory alloy connector which includes the shape-memory alloy material 300 and a thin conductive layer 700 disposed over, for instance, an outer surface of the shape-memory alloy connector. In one or more embodiments, the conductive layer could be a plating, or thin metal layer metallurgically bonded to the shape-memory alloy material. In one or more embodiments, the conductive layer is a low-temperature solder, and/or other metal layer, to facilitate, for instance, secure bonding with the plated through-hole via.

Figure 7B:
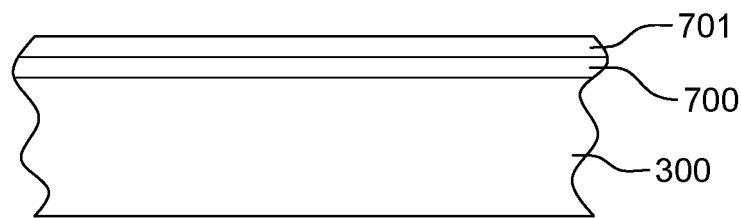
FIG. 7B is a partial depiction of a further embodiment of a shape-memory alloy connector, in accordance with one or more aspects of the present invention.

In FIG. 7B, a further embodiment of a shape-memory alloy connector is depicted where the shape-memory alloy material 300 is provided with a first conductive layer 700 and a second conductive layer 701, which can be different conductive materials. For instance, layer 700 could be a conductive metal layer to enhance electrical characteristics of the connector (e.g., a copper layer), and layer 701 could be a low-temperature solder to facilitate secure bonding and good mechanical and electrical contact with the plated through-hole.

Those skilled in the art will note from the description provided herein that disclosed are various shape-memory alloy connectors and methods using shape-memory alloy material sized and configured in deformed shape smaller than the diameter of a plated through-hole to be repaired and/or enhanced. Once inserted into the plated through-hole, the connector, and more particularly, the shape-memory alloy material of the connector, is heated to expand the connector and provide good mechanical and electrical contact of the connector to the plated sidewalls of the plated through-hole via. As noted, temperature processing of the material is to achieve one-way martensite-to-austenite-to-martensite transformation, so that the material presses against the sidewall of the through-hole, forming (in one or more embodiments) a redundant conductive path. In one or more embodiments, the connector thus makes a forced mechanical contact with the plated through-hole. To metallurgically bond the connector to the plating, the connector surfaces can be plated with, for instance, a low-temperature solder. Once the solder-plated connector is inserted into the plated through-hole, the solder can then be reflowed to make a metallurgical bond with the plating of the plated through-hole. If desired, flux can be added to the connector to improve the solder joint, and the connector can be perforated to allow, for instance, an escape path for flux residue into the middle of the through-hole. With less trapped flux residue, the solder joint is enhanced. In a further embodiment, the outer surface of the shape-memory alloy connector can be metallurgically bonded to a copper layer over the connector, which can enhance thermal and electrical conductivity of the connector.

Figure 8:
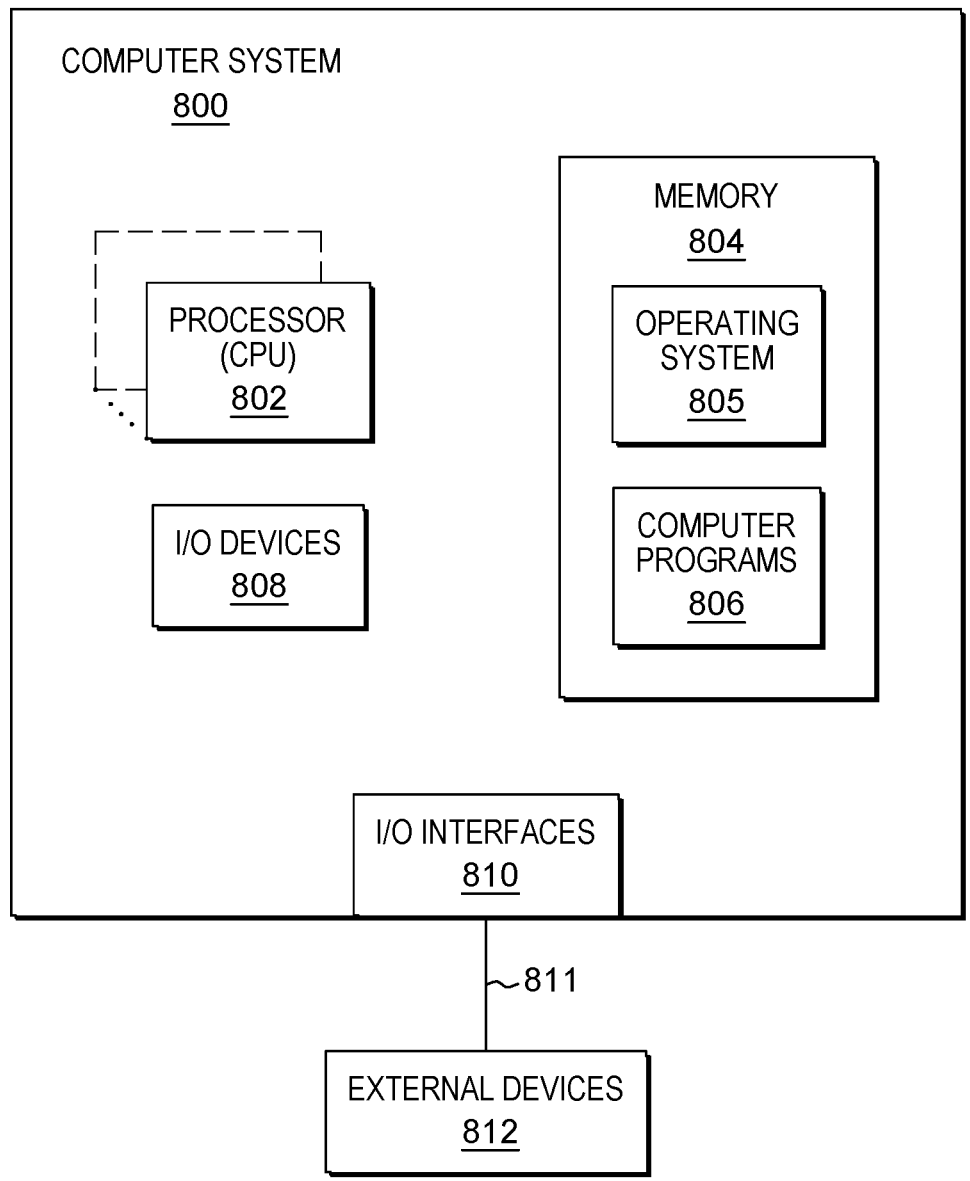
FIG. 8 depicts one example of a computing environment which can facilitate one or more aspects of the present invention.

One or more aspects of the controller discussed herein can be performed by, implemented in association with, or otherwise facilitated by a computer system, one embodiment of which is depicted in FIG. 8. A computer system can be based on one of various system architectures and/or instruction set architectures, such as those offered by International Business Machines Corporation (Armonk, N.Y., USA), Intel Corporation (Santa Clara, Calif., USA) or ARM Holdings PLC (Cambridge, England, United Kingdom), as examples.

FIG. 8 shows a computer system 800 in communication with external device(s) 812. Computer system 800 includes one or more processor(s) 802, for instance, central processing unit(s) (CPUs). A processor can include functional components used in the execution of instructions, such as functional components that fetch program instructions from locations such as cache or main memory, decode program instructions, execute program instructions, access memory for instruction execution, and write results of the executed instructions. A processor 802 can include a register(s) to be used by one or more of the functional components. Computer system 800 also includes memory 804, input/output (I/O) devices 808, and I/O interfaces 810, which can be coupled to processor(s) 802 and each other via one or more busses and/or other connections. Bus connections represent one or more of any of several types of bus structures, including a memory bus or memory controller, a peripheral bus, and a processor or local bus using any of a variety of bus architectures known in the art.

Memory 804 can be or include main or system memory (e.g., random access memory) used in the execution of program instructions, a storage device(s) such as hard drive(s), flash media or optical media as examples, and/or cache memory, as examples. Memory 804 can include, for instance, a cache, such as a shared cache, which can be coupled to local caches (examples include L1 cache, L2 cache, etc.) of processor(s) 802. Additionally, memory 804 can be or include at least one computer program product having a set (e.g., at least one) of program modules, instructions, code or the like that is/are configured to carry out the functions of various control aspects described herein when executed by one or more processors.

Memory 804 can store an operating system 805 and other computer programs 806, such as one or more computer programs/applications that execute to perform aspects described herein. Specifically, program/applications can include computer readable program instructions that can be configured to carry out functions of embodiments of aspects described herein.

Examples of I/O devices 808 include but are not limited to temperature sensors, and other sensor devices coupled to, for instance, sense temperature associated with heating and/or cooling a connector such as disclosed herein. An I/O device can be incorporated into the computer system as shown, though in some embodiments an I/O device can be regarded as an external device 812 coupled to the computer system through one or more I/O interfaces 810.

Computer system 800 can communicate with one or more external devices 812 via one or more I/O interfaces 810. Example external devices include any device that enables computer system 800 to communicate with one or more other devices, such as a variable current source and/or other heating apparatus as described herein. A communication between I/O interfaces 810 and external devices 812 can occur across wired and/or wireless communication link(s) 811, such as Ethernet-based wired or wireless connections. Example wireless connections include cellular, Wi-Fi, Bluetooth®, proximity-based, near field, or other types of wireless connections. More generally, communication link(s) 811 can be any appropriate wireless and/or wired communication link(s) for communicating data. Computer system 800 can take any of various forms, well known examples of which include, but are not limited to, personal computer (PC) system(s), server computer system(s), laptop(s), tablet(s), multiprocessor system(s), multiprocessor-based system(s), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of enhancing connectivity of a plated through-hole of a circuit board, the method comprising:
    inserting a shape-memory alloy connector into the plated through-hole of the circuit board, the shape-memory alloy connector being an elongated connector and comprising a shape-memory alloy material in deformed shape as inserted into the plated through-hole; and
    expanding the shape-memory alloy connector within the plated through-hole by heating the shape-memory alloy material to, at least in part, transition the shape-memory alloy material towards a pre-deformed shape thereof, wherein transitioning the shape-memory alloy material towards the pre-deformed shape expands the shape-memory alloy connector radially outward along the length of the shape-memory alloy connector within the plated through-hole to press the shape-memory alloy connector, against plating of the plated through-hole to enhance contact of the shape-memory alloy connector with the plating of the plated through-hole within the plated through-hole.

2. The method of claim 1, wherein the shape-memory alloy material of the shape-memory alloy connector is a one-way shape-memory alloy material.

3. The method of claim 2, wherein the heating is at a temperature for one-way martensite to austenite phase transformation of the shape-memory alloy material to occur within the plated through-hole.

4. The method of claim 2, wherein the shape-memory alloy material in deformed shape is a coiled sheet of shape-memory alloy material and is sized to facilitate the inserting of the shape-memory alloy connector into the plated through-hole of the circuit board.

5. The method of claim 2, wherein the shape-memory alloy material in deformed shape is a sleeve sized to facilitate the inserting of the shape-memory alloy connector into the plated through-hole of the circuit board.

6. The method of claim 5, wherein the shape-memory alloy material is an elongate sleeve, and includes a lengthwise slit that facilitates expanding of the shape-memory alloy material within the plated through-hole with the heating of the shape-memory alloy material.

7. The method of claim 2, wherein the shape-memory alloy connector is configured as a shape-memory alloy pin, and the shape-memory alloy material is stretched in the deformed shape to have a reduced diameter, and wherein the heating expands the diameter of the shape-memory alloy pin within the plated through-hole.

8. The method of claim 1, wherein the shape-memory alloy connector includes a solder plating on an outer surface thereof, and wherein the method further comprises heating the solder of the shape-memory alloy connector within the plated through-hole to enhance electrical contact of the shape-memory alloy connector with the plating of the plated through-hole by metallurgical bonding.

9. The method of claim 1, wherein the shape-memory alloy connector includes a conductive film on an outer surface thereof, and wherein the expanding of the shape-memory alloy connector forces the conductive film of the shape-memory alloy connector against the plating of the plated through-hole to enhance electrical contact of the shape-memory alloy connector with the plating of the plated through-hole.

10. A method of providing a connector for a plated through-hole of a circuit board, the method comprising:
    obtaining a shape-memory alloy material, the shape-memory alloy material being a one-way shape-memory alloy material;
    deforming the shape-memory alloy material to a deformed shape in a de-twinned martensite phase to define, at least in part, a shape-memory alloy connector that is an elongated connector sized for insertion into the plated through-hole; and
    wherein when the shape-memory alloy connector is inserted into and heated within the plated through-hole, the shape-memory alloy material transitions towards a pre-deformed shape thereof, the transitioning towards the pre-deformed shape expanding the shape-memory alloy connector radially outward along the length of the shape-memory alloy connector within the plated through-hole, pressing the shape-memory alloy connector against plating of the plated through-hole to enhance contact of the shape-memory alloy connector with the plating of the plated through-hole within the plated through-hole.

11. The method of claim 10, wherein the deforming comprises deforming the shape-memory alloy material into a coiled sheet sized to facilitate inserting of the shape-memory alloy connector into the plated through-hole.

12. The method of claim 10, wherein the deforming comprises deforming the shape-memory alloy material into a sleeve sized to facilitate insertion of the shape-memory alloy connector into the plated through-hole.

13. The method of claim 12, further comprising providing a lengthwise slit in the shape-memory alloy material deformed as a sleeve to facilitate expanding of the shape-memory alloy material within the plated through-hole with heating of the shape-memory alloy material.

14. The method of claim 10, wherein the deforming of the shape-memory alloy material comprises deforming the shape-memory alloy material into the form of a pin by stretching the shape-memory alloy material to the deformed shape to have a reduced diameter, and wherein heating expands the diameter of the shape-memory alloy material within the plated through-hole.

15. The method of claim 10, further comprising providing a solder plating on an outer surface of the shape-memory alloy connector, wherein when heated within the plated through-hole, the solder enhances electrical contact of the shape-memory alloy connector with the plating of the plated through-hole by metallurgical bonding.

16. The method of claim 10, further comprising providing a conductive film on an outer surface of the shape-memory alloy connector, wherein the expanding of the shape-memory alloy connector forces the conductive film of the shape-memory alloy connector against the plating of the plated through-hole to enhance electrical contact of the shape-memory alloy connector with the plating of the plated through-hole.

17. A connector for a plated through-hole of a circuit board, the connector comprising:
   a shape-memory alloy material, the shape-memory alloy material being a one-way shape-memory alloy material;
   the shape-memory alloy material being in a deformed shape in a de-twinned martensite phase to define, at least in part, a shape-memory alloy connector that is an elongated connector sized for insertion into the plated through-hole; and
   wherein when the shape-memory alloy connector is inserted into and heated within the plated through-hole, the shape-memory alloy material transitions towards a pre-deformed shape thereof, the transitioning towards the pre-deformed shape expanding the shape-memory alloy connector radially outward along the length of the shape-memory alloy connector within the plated through-hole, pressing the shape-memory alloy connector against plating of the plated through-hole to enhance contact of the shape-memory alloy connector with the plating of the plated through-hole within the plated through-hole.

18. The connector of claim 17, wherein the shape-memory alloy material in the deformed shape is a coiled sheet of shape-memory allow material and is sized to facilitate the insertion of the shape-memory alloy connector into the plated through-hole of the circuit board.

19. The connector of claim 17, wherein the shape-memory alloy connector includes a solder plating on an outer surface thereof, and wherein when heated, the solder of the shape-memory alloy connector enhances electrical contact of the shape-memory alloy connector with the plating of the plated through-hole by metallurgical bonding.

20. The connector of claim 17, wherein the shape-memory alloy connector further includes a conductive film on an outer surface thereof, and wherein when the shape-memory alloy connector expands, the conductive film of the shape-memory alloy connector is forced against the plating of the plated through-hole to enhance electrical contact of the shape-memory alloy connector with the plating of the plated through-hole.

* * * * *